(12) United States Patent
Yim et al.

(10) Patent No.: US 9,324,771 B2
(45) Date of Patent: Apr. 26, 2016

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-Do (KR)

(72) Inventors: Sang-Hoon Yim, Yongin (KR); Kyung-Ho Kim, Yongin (KR); Young-Woo Song, Yongin (KR); Jong-Hyuk Lee, Yongin (KR); Kwan-Hyun Cho, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 189 days.

(21) Appl. No.: 14/250,464

(22) Filed: Apr. 11, 2014

(65) Prior Publication Data

US 2015/0034918 A1 Feb. 5, 2015

(30) Foreign Application Priority Data

Aug. 2, 2013 (KR) .................. 10-2013-0092243

(51) Int. Cl.
*H01L 27/32* (2006.01)
*H01L 51/56* (2006.01)

(52) U.S. Cl.
CPC ............. *H01L 27/323* (2013.01); *H01L 51/56* (2013.01)

(58) Field of Classification Search
CPC .............................. H01L 27/323; H01L 51/56
See application file for complete search history.

(56) References Cited

U.S. PATENT DOCUMENTS

| | | | |
|---|---|---|---|
| 9,148,141 B2 * | 9/2015 | Lai ......................... | G06F 3/044 |
| 2003/0151354 A1 | 8/2003 | Takizawa | |
| 2006/0022897 A1 | 2/2006 | Windover et al. | |
| 2009/0160824 A1 * | 6/2009 | Chih-Yung ............. | G06F 3/044 |
| | | | 345/175 |
| 2009/0236981 A1 * | 9/2009 | Chang ................. | H01L 51/5253 |
| | | | 313/504 |
| 2014/0160411 A1 * | 6/2014 | Yim .................... | G02F 1/33553 |
| | | | 349/113 |
| 2014/0267953 A1 * | 9/2014 | Kim ........................ | G06F 3/044 |
| | | | 349/12 |

(Continued)

FOREIGN PATENT DOCUMENTS

| | | |
|---|---|---|
| JP | 2003-177679 A | 6/2003 |
| JP | 2005-332616 A | 12/2005 |
| KR | 10-2004-0031826 A | 4/2004 |

(Continued)

OTHER PUBLICATIONS

Hsing-Hung Hsieh et al., Mirror Displays Based on AMOLEDs and Transflective Mirror Designs, SID 2012 Digest, pp. 537-540, AU Optronics Corporation, Hsinchu, Taiwan.

*Primary Examiner* — Joseph C Nicely
(74) *Attorney, Agent, or Firm* — Lee & Morse, P.C.

(57) ABSTRACT

An organic light-emitting display apparatus includes a first substrate including a display unit having a light-emitting region and a non-light-emitting region, a second substrate parallel to the first substrate, and a reflective member on a surface of the second substrate that faces the first substrate, the reflective member corresponding to the non-light-emitting region of the display unit and being configured to sense touch, and the reflective member including a plurality of first pattern parts electrically connected along a first direction and a plurality of second pattern parts electrically connected along a second direction.

20 Claims, 5 Drawing Sheets

(56) References Cited

U.S. PATENT DOCUMENTS

| | | | | |
|---|---|---|---|---|
| 2015/0060125 A1* | 3/2015 | Stevenson | ............... | G06F 3/041 174/261 |
| 2015/0070604 A1* | 3/2015 | Chen | ....................... | G06F 3/044 349/12 |
| 2015/0138145 A1* | 5/2015 | Hwang | ................ | G06F 3/0418 345/174 |
| 2015/0153873 A1* | 6/2015 | Lee | ......................... | G06F 3/044 345/174 |
| 2015/0205418 A1* | 7/2015 | Nam | ....................... | G06F 3/044 345/174 |
| 2015/0220120 A1* | 8/2015 | Lee | ....................... | G06F 1/1652 345/173 |

FOREIGN PATENT DOCUMENTS

| | | |
|---|---|---|
| KR | 20-0400903 Y1 | 11/2005 |
| KR | 10-2014-0073216 A | 6/2014 |

* cited by examiner

ORGANIC LIGHT-EMITTING DISPLAY APPARATUS AND METHOD OF MANUFACTURING THE SAME

CROSS-REFERENCE TO RELATED APPLICATION

Korean Patent Application No. 10-2013-0092243, filed on Aug. 2, 2013, in the Korean Intellectual Property Office, and entitled: "ORGANIC LIGHT-EMITTING DISPLAY APPARATUS AND METHOD OF MANUFACTURING THE SAME," is incorporated by reference herein in its entirety.

BACKGROUND

1. Field

One or more embodiments relate to an organic light-emitting display apparatus and a method of manufacturing the same.

2. Description of the Related Art

Recently, there is a trend to replace display apparatuses with portable, thin flat display apparatuses. Methods of realizing a mirror function by using external light reflection, as well as a display function, have recently been proposed.

SUMMARY

One or more embodiments are directed to an organic light-emitting display apparatus that may realize a mirror function and a touch sensing function while not deteriorating display quality and efficiency.

According to one or more embodiments, an organic light-emitting display apparatus includes a first substrate including a display unit having a light-emitting region and a non-light-emitting region, a second substrate parallel to the first substrate, and a reflective member on a surface of the second substrate that faces the first substrate, the reflective member corresponding to the non-light-emitting region of the display unit and being configured to sense touch, and the reflective member including a plurality of first pattern parts electrically connected along a first direction and a plurality of second pattern parts electrically connected along a second direction.

At least one of the first pattern part and the second pattern part may include a region corresponding to the light-emitting region.

The first direction and the second direction may be perpendicular to each other.

The second substrate may further include first connection parts connecting the first pattern parts; second connection parts crossing the first connection parts and connecting the second pattern parts; and an insulating layer formed on the first pattern parts and the second pattern parts to cover boundaries between the first pattern parts and the second pattern parts.

The first connection part may be formed of the same material as the first pattern part.

The second connection part may be insulated from the first connection part by the insulating layer and may be in contact with each of a pair of the adjacent second pattern parts.

The insulating layer may include body parts in a form of a line overlapping the first pattern parts along the second direction, and third connection parts overlapping the first connection parts and connecting the adjacent body parts.

The third connection part in a form of an island may be connected to the body parts.

The insulating layer may cover a region corresponding to the light-emitting region.

The insulating layer may be a dielectric mirror.

The insulating layer may include at least one layer having a low refractive index and at least one layer having a high refractive index.

The insulating layer may include at least one of silicon oxide ($SiO_2$) and silicon nitride ($SiN_x$).

A refractive index of the insulating layer may be higher than a refractive index of the second substrate.

According to one or more embodiments, a method of manufacturing an organic light-emitting display apparatus includes providing a first substrate including a display unit, the display unit having a light-emitting region and a non-light-emitting region, providing a second substrate parallel to the first substrate, forming a reflective member on a surface of the second substrate, such that the reflective member corresponds to the non-light-emitting region and faces the first substrate, patterning the reflective member to form a plurality of first pattern parts disposed along a first direction and connected to one another, and a plurality of second pattern parts disposed along a second direction; and connecting the plurality of second pattern parts to one another, and aligning and bonding the first substrate and the second substrate parallel to the first substrate.

The method may further include forming an insulating layer on the first pattern parts and the second pattern parts to cover boundaries between the first pattern parts and the second pattern parts.

The forming of the insulating layer may include forming a first insulating layer in a form of a line overlapping the first pattern parts along the second direction and a second insulating layer overlapping a region connecting the first connection parts and connecting the adjacent first insulating layers.

The connecting of the second pattern parts may include forming a first connection part that connects the first pattern parts, and a second connection part that is insulated by the insulating layer, crosses the first connection part, and is in contact with each of a pair of the adjacent second pattern parts.

The forming of the insulating layer may include alternatingly stacking at least one layer having a low refractive index and at least one layer having a high refractive index.

The insulating layer may include at least one of silicon oxide ($SiO_2$) and silicon nitride ($SiN_x$).

A refractive index of the insulating layer may be higher than a refractive index of the second substrate.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
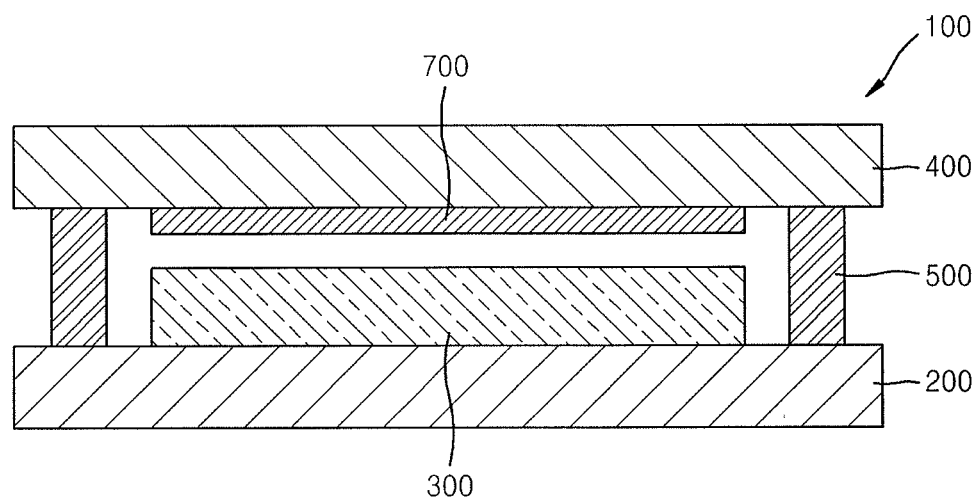
FIG. 1 illustrates a schematic cross-sectional view of a display apparatus according to an embodiment.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

It will be understood that although the terms "first", "second", etc. may be used herein to describe various components, these components should not be limited by these terms. These components are only used to distinguish one component from another.

The terminology used herein is for the purpose of describing particular example embodiments only and is not intended to be limiting. As used herein, the singular forms "a", "an", and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

The dimensions of layers and regions in the drawings may be exaggerated for clarity of illustration. It will be understood that when a layer, region, or component is referred to as being "on" another layer, region, or component, it can be directly or indirectly on the other layer, region, or component. That is, for example, intervening layers, regions, or components may be present.

As used herein, the term "and/or" includes any and all combinations of one or more of the associated listed items. Expressions such as "at least one of," when preceding a list of elements, modify the entire list of elements and do not modify the individual elements of the list.

Figure 2:
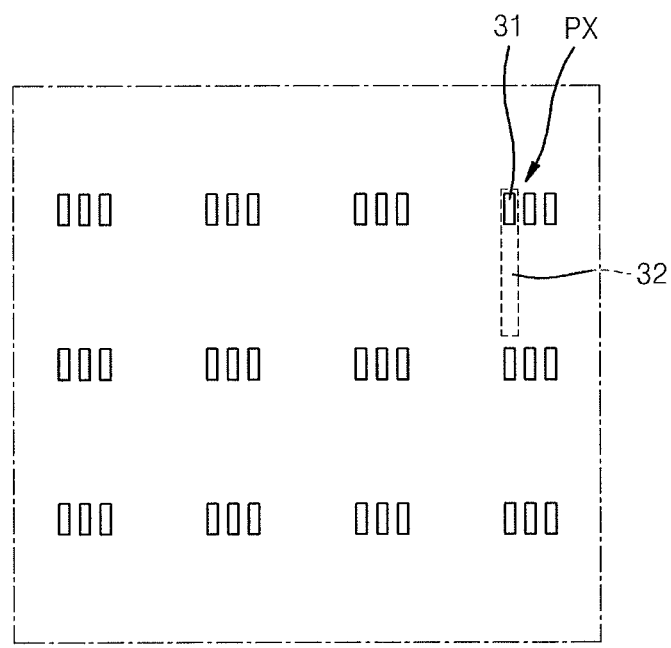
FIG. 2 illustrates a plan view of a part of a display unit on a first substrate in FIG. 1.
Figure 3:
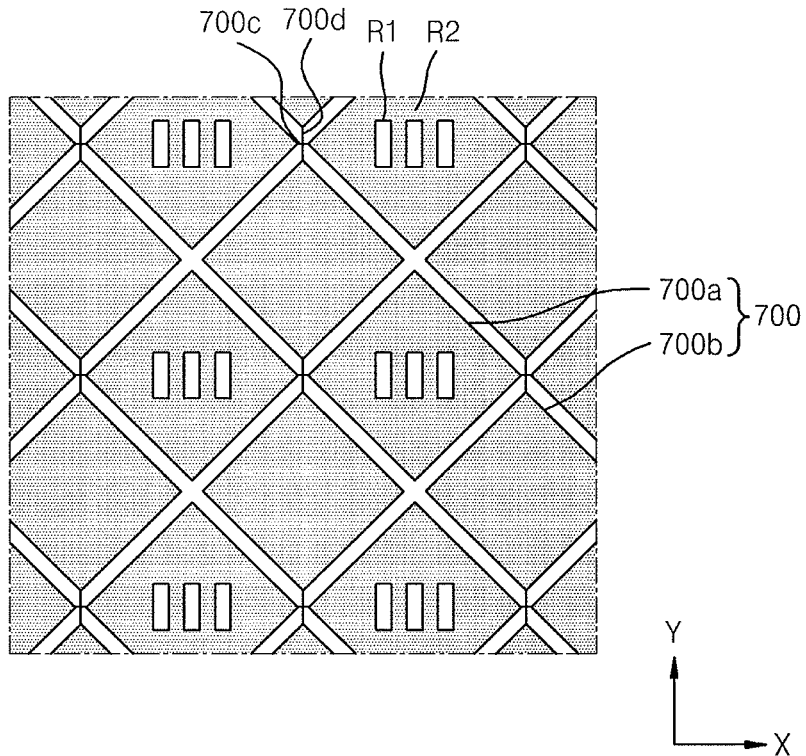
FIG. 3 illustrates a plan view of a part of a reflective member on a second substrate illustrated in FIG. 1.

FIG. 1 is a cross-sectional view schematically illustrating an organic light-emitting display apparatus 100 according to an embodiment. FIG. 2 is a plan view illustrating a part of a display unit 300 on a first substrate illustrated in FIG. 1. FIG. 3 is a plan view illustrating a part of a reflective member 700 on a second substrate illustrated in FIG. 1.

Referring to FIG. 1, the display apparatus 100 according to embodiments may include a first substrate 200, the display unit 300 included on the first substrate 200, and a second substrate 400. The first substrate 200 and the second substrate 400 are bonded by a sealing member 500. An absorbent or a filler may be disposed in a space that is formed between the first substrate 200 and the second substrate 400 by the sealing member 500.

The first substrate 200 and the second substrate 400 may be formed of a transparent glass material including SiO₂ as a main component. However, the first substrate 200 and the second substrate 400 are not necessarily limited thereto, and the first substrate 200 and the second substrate 400 may be formed of a transparent plastic material.

The display unit 300 on the first substrate 200 includes a plurality of pixels PX. A single pixel PX may emit a single color, e.g., any one of red, blue, green, and white colors. However, embodiments are not limited thereto, e.g., a single pixel PX may emit another color in addition to the red, blue, green, and white colors.

Referring to FIG. 2, each pixel PX includes a light-emitting region 31 and a non-light-emitting region 32. As a result, the display unit 300 includes a plurality of light-emitting regions 31 and non-light-emitting regions 32 around the light-emitting regions 31.

The light-emitting region 31 is a region in which a light-emitting device of each pixel PX directly emits visible light to form an image that is recognized by a user. The light-emitting region 31 may be formed in various shapes. A circuit for driving the light-emitting region 31 may be disposed to overlap the light-emitting region 31 or may be disposed in the non-light-emitting region 32. Although not illustrated in FIG. 2, each pixel PX may include a transmission region in the non-light-emitting region 32 and the adjacent pixels PX may also include a common transmission region.

The second substrate 400 is an encapsulation member sealing the display unit 300. The reflective member 700 is formed on a surface of the second substrate 400 facing the first substrate 200. The reflective member 700 may be formed of a reflector, i.e., a material that reflects light incident from the outside, and may include a predetermined metal. For example, the reflective member 700 may include aluminum (Al), chromium (Cr), silver (Ag), iron (Fe), platinum (Pt), mercury (Hg), nickel (Ni), tungsten (W), vanadium (V), and/or molybdenum (Mo). Also, the reflective member 700 may be formed of multiple layers that include a single layer formed of the above metal between transparent conductive metal oxides.

The reflective member 700 may have an appropriate reflectance. That is, the reflective member 700 may have a reflectance that is substantially the same as a reflectance of each pixel PX, e.g., the same as a reflectance of the light-emitting region 31. For example, a difference between the reflectance of the reflective member 700 and the average reflectance of the light-emitting region 31 may be within about 10%. As a result, the organic light-emitting display apparatus 100, according to the present embodiment, may simultaneously realize a mirror function as well as an image display function. Also, the reflective member 700 may have an appropriate thickness according to the reflectance.

Referring to FIG. 3, the reflective member 700 may include first pattern parts 700a connected to one another along an X-direction and second pattern parts 700b connected to one another along a Y-direction that is substantially perpendicular to the X-direction. The first pattern parts 700a and the second pattern parts 700b may be alternately disposed. For example, the first pattern parts 700a and the second pattern parts 700b may roughly have a diamond (rhombus) shape.

The first pattern part 700a is formed to include a predetermined number of first regions R1. The first regions R1 are openings through a second region R2. The first regions R1 correspond to, e.g., overlap, the light-emitting region 31 of the pixel PX. The second pattern part 700b includes only the second region R2, i.e., regions without the first regions R1, corresponding to, e.g., overlapping, the non-light-emitting region 32. For example, the first pattern part 700a may be arranged to have the first regions R1 above and aligned with corresponding pixels PX in the light-emitting region 31, while the second pattern part 700b may be arranged above the non-light-emitting region 32, e.g., above regions having no light emitting devices.

The first pattern parts 700a are electrically connected to each other, and the second pattern parts 700b are electrically connected to each other. Thus, the first pattern parts 700a and the second pattern parts 700b may respectively act as a sensing electrode. A touch signal sensed by the first pattern part 700a and the second pattern part 700b is provided to a driving circuit (not shown), and the driving circuit may detect a touch position based on the touch signal. That is, according to an embodiment, since the reflective member 700 is patterned to be formed as a grid, a mirror function as well as a touch sensing function may be simultaneously realized. A detailed configuration of the reflective member 700 will be described later.

Figure 4:
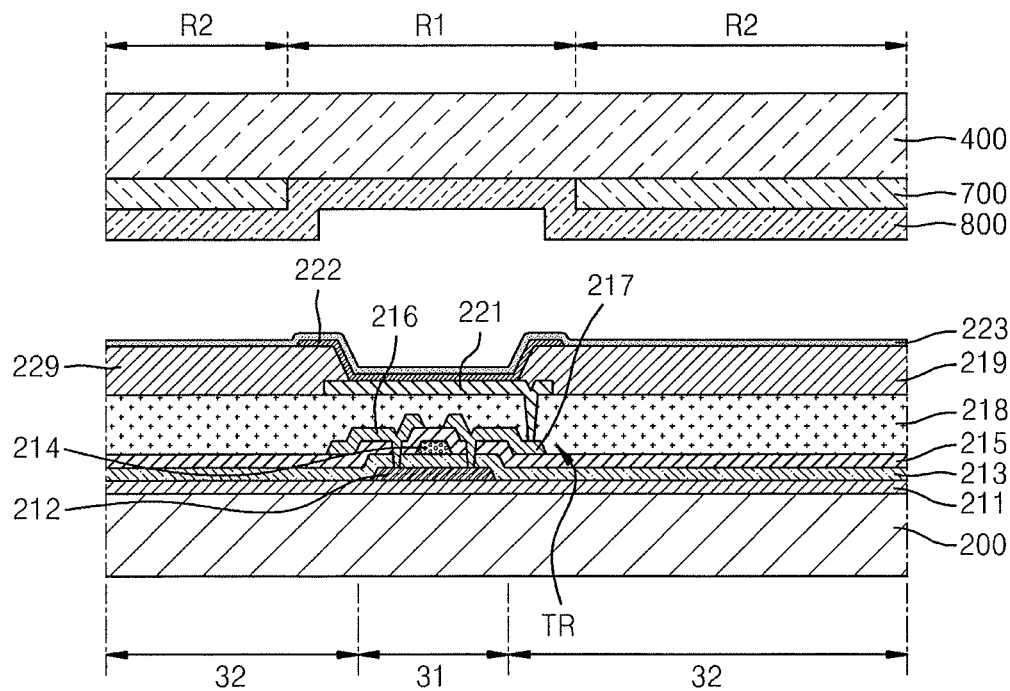
FIG. 4 illustrates a cross-sectional view of a part of a pixel in FIG. 2.

FIG. 4 is a cross-sectional view of a part of the pixel PX illustrated in FIG. 2. For example, the display unit 300 including the pixel PX may be an organic light-emitting display unit.

Referring to FIG. 4, the pixel PX may include a light-emitting device, e.g., an organic light emitting device, and a thin film transistor TR disposed in the light-emitting region 31. The light-emitting device may include a first electrode 221, a second electrode 223, and an intermediate layer 222. The light-emitting device may be electrically connected to the TR thereunder. The TR may include an active layer 212, a gate electrode 214, a source electrode 216, and a drain electrode 217.

First, a buffer layer 211 is formed on the first substrate 200, and the active layer 212 is formed on the buffer layer 211. The buffer layer 211 may be omitted if necessary. The active layer 212 may be formed of an inorganic semiconductor, e.g., amorphous silicon or polysilicon, an oxide semiconductor, or an organic semiconductor. The active layer 212 includes a source region and a drain region, which are doped with impurities, and a channel region therebetween.

A gate insulating layer 213 is formed on the active layer 212, and the gate electrode 214 is formed on the gate insulating layer 213. The gate insulating layer 213 insulates the gate electrode 214 from the active layer 212. The gate insulating layer 213 may be formed of an organic material or an inorganic material, e.g., $SiN_x$ and $SiO_2$.

The gate electrode 214 is formed to correspond to the center of the active layer 212. The gate electrode 214 may contain gold (Au), Ag, copper (Cu), Ni, Pt, palladium (Pd), Al, or Mo, and may include one or more of Ag, magnesium (Mg), Al, Pt, Pd, Au, Ni, neodymium (Nd), iridium (Ir), Cr, lithium (Li), calcium (Ca), Mo, titanium (Ti), W, MoW, and Cu. However, embodiments are not limited thereto, and the gate electrode 214 may be formed of various materials in consideration of adhesion with adjacent layers, flatness, electrical resistance, and processability. Also, the gate electrode 214 may be formed as a single layer or a multilayer.

An interlayer insulating layer 215 is formed on the gate electrode 214. The interlayer insulating layer 215 may be formed of an inorganic insulating material, or one or more organic insulating materials, e.g., polyimide, polyamide, an acryl resin, benzocyclobutene, and a phenol resin. The interlayer insulating layer 215 may also be formed by alternately stacking an organic insulating material and an inorganic insulating material.

The interlayer insulating layer 215 and the gate insulating layer 213 are formed to expose the source region and the drain region of the active layer 212, and the source electrode 216 and the drain electrode 217 are formed to be in contact with the exposed source region and drain region of the active layer 212. The source electrode 216 and the drain electrode 217 may be formed of the same conductive material as the gate electrode 214. However, the source electrode 216 and the drain electrode 217 are not limited thereto, and may be formed of various conductive materials. The source electrode 216 and the drain electrode 217 may have a single layer structure or a multilayer structure.

A passivation layer 218 as a kind of insulating layer is formed to cover the TR. The passivation layer 218 may be formed of an inorganic material and/or an organic material.

The first electrode 221 of the EL, which is electrically connected to the TR, is formed on the passivation layer 218. The first electrode 221 is disposed to cover the TR by overlapping the TR. A pixel-defining layer 219, which is formed of an organic insulating material and/or an inorganic insulating material and covers edges of the first electrode 221, is formed on the passivation layer 218.

The intermediate layer 222 and the second electrode 223 are sequentially stacked on the first electrode 221. The first electrode 221 may be formed in a stack structure of a transparent conductor and a reflective layer. Herein, the transparent conductor may include a high work function material, e.g., indium tin oxide (ITO), indium zinc oxide (IZO), ZnO, or $In_2O_3$. The reflective layer may include at least one metal, e.g., Ag, Mg, Al, Pt, Pd, Au, Ni, Nd, Ir, Cr, Li, Ca, Mo, and an alloy thereof.

The second electrode 223 may be formed of, e.g., Ag, Mg, Al, Pt, Pd, Au, Ni, Nd, Ir, Cr, Li, Ca, Mo, or an alloy thereof. Also, in some cases, the second electrode 223 may be formed of, e.g., ITO, IZO, ZnO, or $In_2O_3$. Herein, the second electrode 223 may be formed as a thin film having a thickness ranging from about 100 Å to about 300 Å in order to have a high transmittance. Therefore, the light-emitting device is a top emission-type device, in which an image is formed in a direction of the second electrode 223.

The intermediate layer 222 may be formed by stacking an organic emissive layer (EML) and at least any one functional layer, e.g., a hole transport layer (HTL), a hole injection layer (HIL), an electron transport layer (ETL), and/or an electron injection layer (EIL), in a single or composite structure. Pixels emitting red, green, and blue light respectively include the intermediate layers 222 that include EMLs emitting red, green, and blue light. As another example, the pixels emitting red, green, and blue light may emit light having the same color, for example, white light. In this case, a color converting layer that converts each white light into a predetermined color or a color filter may be used. In order to emit while light, the intermediate layer 222 may include a structure, in which at least a red light-emitting material, a green light-emitting material, and a blue light-emitting material are stacked. As another example, the intermediate layer 222 may include a structure, in which at least a red light-emitting material, a green light-emitting material, and a blue light-emitting material are mixed, in order to emit while light.

Although not shown in FIG. 4, a capping layer may be formed on the second electrode 223. The capping layer may include an organic material, an inorganic material, or a mixture thereof, and may be formed on the second electrode 223 to improve viewing angle characteristics and increase an external luminous efficiency. Also, the capping layer may prevent deterioration of the electrode and organic layer thereunder due to external moisture or oxygen.

Although a single TR is illustrated in FIG. 4, embodiments are not limited thereto. A plurality of thin film transistors and capacitors may be further included, and interconnections, e.g., scan lines, data lines, and power lines, connected thereto may be further included. Also, FIG. 4 illustrates a circuit for driving a pixel that overlaps the light-emitting region 31 only as an example, e.g., the driving circuit may be disposed in the non-light-emitting region 32 so that the driving circuit may not overlap the light-emitting region 31.

And a reflective member 700 and an insulating layer 800 are formed on a surface of the second substrate 400 which faces the first substrate 200. The reflective member 700 comprises a first region R1 corresponding to the light-emitting region 31 and a second region R2 corresponding to the non-light-emitting region 32.

FIGS. 5 to 9 are plan views of stages in a process of forming an organic light-emitting display apparatus including the reflective member 700.

Figure 5:
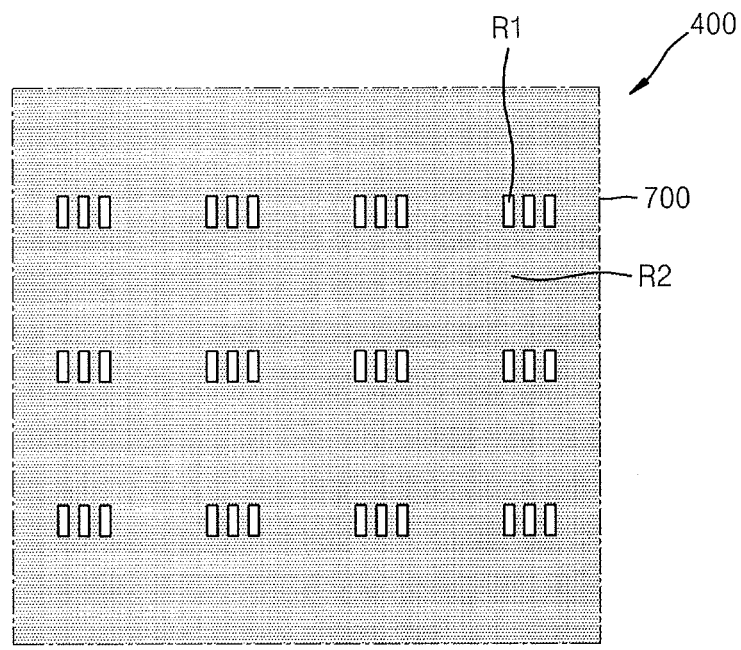
FIGS. 5 to 9 illustrate partial plan views of stages in a process of forming an organic light-emitting display apparatus including the reflective member in FIG. 3.

Referring to FIG. 5, the reflective member 700, e.g., a reflective layer, is formed on the surface of the second substrate 400 that faces the first substrate 200. The display unit 300 including the light-emitting region 31 and the non-light-emitting region 32 is formed on the first substrate 200 and faces the second substrate 400, e.g., the display unit 300 faces the reflective layer on the second substrate 400.

The reflective member 700, e.g., the reflective layer, is formed to correspond to the non-light-emitting region 32 of the display unit 300. Thus, the first regions R1 corresponding to the light-emitting region 31 and the second region R2 corresponding to the non-light-emitting region 32 are included in the reflective layer on the second substrate 400.

Figure 6:
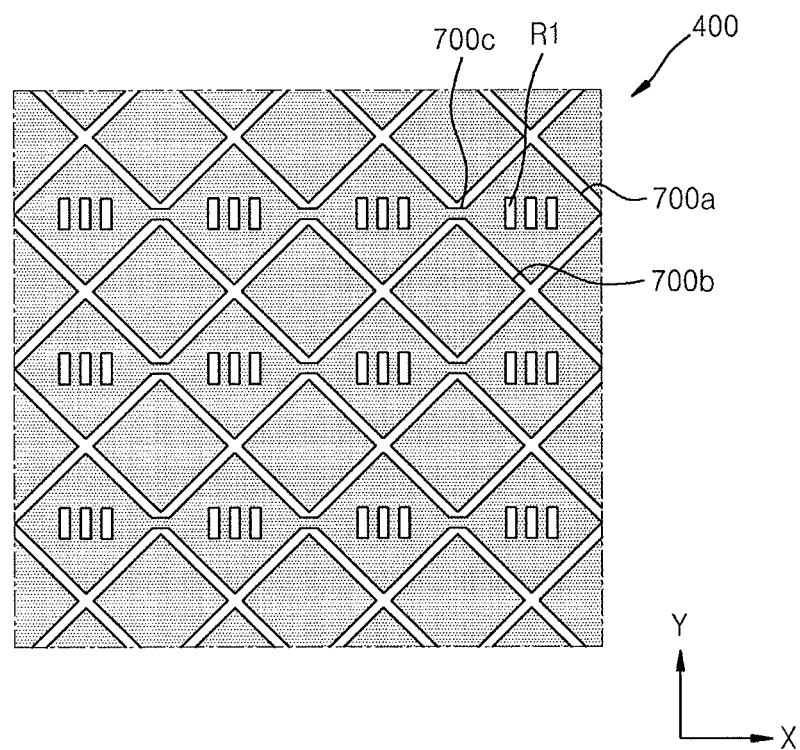

Next, referring to FIG. 6, the reflective member 700, i.e., the reflective layer with the first regions R1 therethrough, is patterned to form the first pattern parts 700a and the second pattern parts 700b. That is, the reflective member 700 is partitioned into a plurality of patterns, so the plurality of the first pattern parts 700a disposed along the first direction and connected to one another, and the plurality of the second pattern parts 700b disposed along the second direction may be formed. The reflective member 700 is patterned such that the first pattern parts 700a and the second pattern parts 700b are alternately disposed.

In detail, referring to FIG. 6, the plurality of first pattern parts 700a may be formed side-by-side while corners thereof are facing each other along the X-direction, and the plurality of second pattern parts 700b may be formed side-by-side between the plurality of first pattern parts 700a while corners thereof are facing each other along the Y-direction. Neighboring first pattern parts 700a in a same row are connected to each other by a first connection part 700c. The first connection part 700c may be formed in one piece of a same material as the first pattern part 700a, e.g., the first pattern parts 700a and the first connection parts 700c in a same row may be formed integrally with each other. The first pattern parts 700a are patterned, such that the first regions R1 corresponding to the light-emitting regions 31 are defined. At this stage, as illustrated in FIG. 6, second pattern parts 700b in a same column are still insulated from one another.

Figure 7:
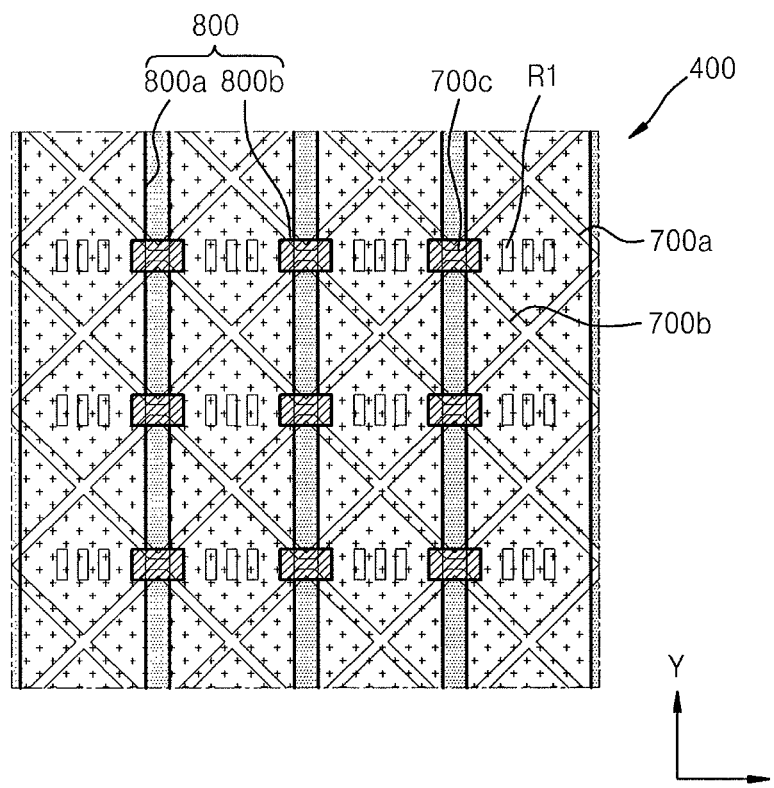

Next, referring to FIG. 7, an insulating layer 800 is formed on the first pattern parts 700a, the second pattern parts 700b, and the first connection part 700c. For example, the insulating layer 800 may be between the first connection part 700c and the third connection part 700b (FIG. 9), but allows the third connection part 700d to connect, e.g., directly, to the second pattern part 700b.

The insulating layer 800 may include a dielectric mirror that has a high reflectance and is a non-conductor, i.e., an electrically non-conductor. The insulating layer 800 may include at least one layer having a low refractive index and at least one layer having a high refractive index. For example, the insulating layer 800 may be formed by alternately stacking silicon nitride ($SiN_x$) having a high refractive index and silicon oxide ($SiO_2$) having a low refractive index. The insulating layer 800 may have a refractive index higher than that of the second substrate 400.

The insulating layer 800 may be formed to cover boundaries between the first pattern parts 700a and the second pattern parts 700b, and thus, the plurality of patterns of the reflective member 700 may not be recognized by a user. For example, the insulating layer 800 may include a body part 800a overlapping the first pattern parts 700a of each column along the second direction, and second connection parts 800b connecting neighboring body parts 800a.

In detail, the body part 800a may be formed in the form of a line on the first pattern parts 700a, and thus, the body part 800a may cover boundaries between adjacent first patterns 700a, between adjacent first and second pattern parts 700a and 700b, and between adjacent second pattern parts 700b. For example, the body part 800a may continuously overlap, e.g., cover a majority of, a column of first pattern parts 700a and corresponding, e.g., triangular, portions of the second pattern parts 700b. As such, the body part 800a may cover, e.g., completely overlap, the first regions R1, an opening of the reflective member 700 corresponding to the light-emitting region 31.

The second connection part 800b may be formed in the form of an island on the first connection part 700c at a position overlapping the first connection part 700c. Thus, the second connection part 800b may expose a portion of the second pattern part 700b, e.g., a gray linear part in FIG. 7, while covering a boundary of a connected area between the first pattern parts 700a. As a result, a third connection part 700d to be later formed (FIG. 9) may be directly in contact with the second pattern part 700b without a contact hole.

Also, the second connection part 800b may prevent a short circuit between the first connection part 700c and the third connection part 700d by being disposed therebetween. Since the boundaries between the first pattern parts 700a and the second pattern parts 700b are covered by the body parts 800a and the second connection parts 800b, a diffraction phenomenon due to the boundaries between the patterns may be prevented.

In the embodiment of FIG. 7, the second connection part 800b is formed on or under the body part 800a separately from the body part 800a. However, embodiments are not limited thereto. For example, as illustrated in FIG. 8, the body part 800a and the second connection part 800b' may be formed in one piece, i.e., seamlessly integral with each other, such that only openings exposing portions of the second pattern parts 700b are formed in an insulating layer 800'.

Figure 8:
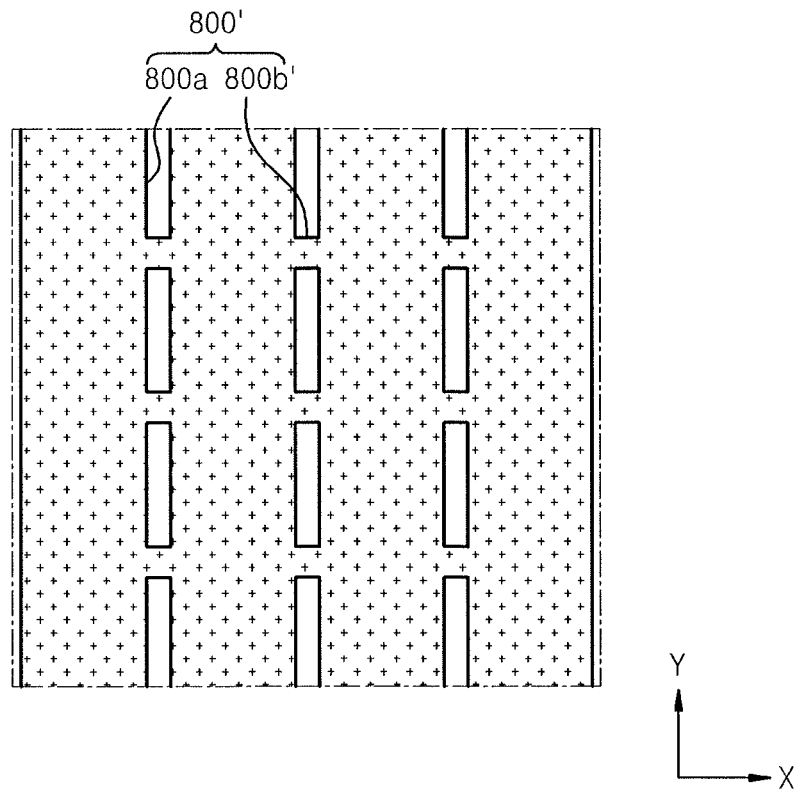

Also, embodiments are not limited to the forms of the insulating layers 800 and 800' that are illustrated in FIGS. 7 and 8. For example, a structure may be used, in which the second pattern parts 700b may be connected to one another, while the third connection part 700d which does not short-circuit with the first connection part 700c, as well as the boundaries between the first pattern parts 700a and the second pattern parts 700b, are covered.

Figure 9:
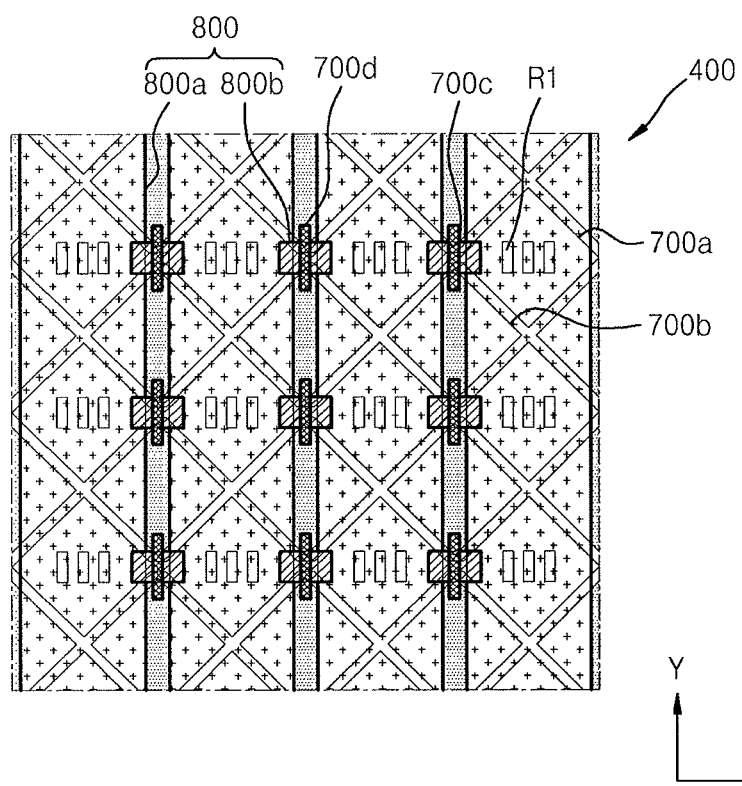

Next, referring to FIG. 9, the third connection parts 700d are formed on the insulating layer 800. The third connection part 700d may function to connect the second pattern parts 700b to each other along the second direction.

The third connection part 700d is formed on the second connection part 800b and is directly in contact with each of a pair of the second pattern parts 700b adjacent to each other along the Y-direction to electrically connect the second pattern parts 700b to each other. The third connection part 700d may be formed of a conductive material that is the same as the reflective member 700. However, the third connection part 700d is not limited thereto, e.g., the third connection part 700d may be formed of various conductive materials other than the material of the reflective member 700.

Next, The second substrate 400 on which the reflective member 700 and the insulating layer 800 are formed is arranged in parallel to the first substrate, and the first substrate and the second substrate are bonded.

Figure 10:
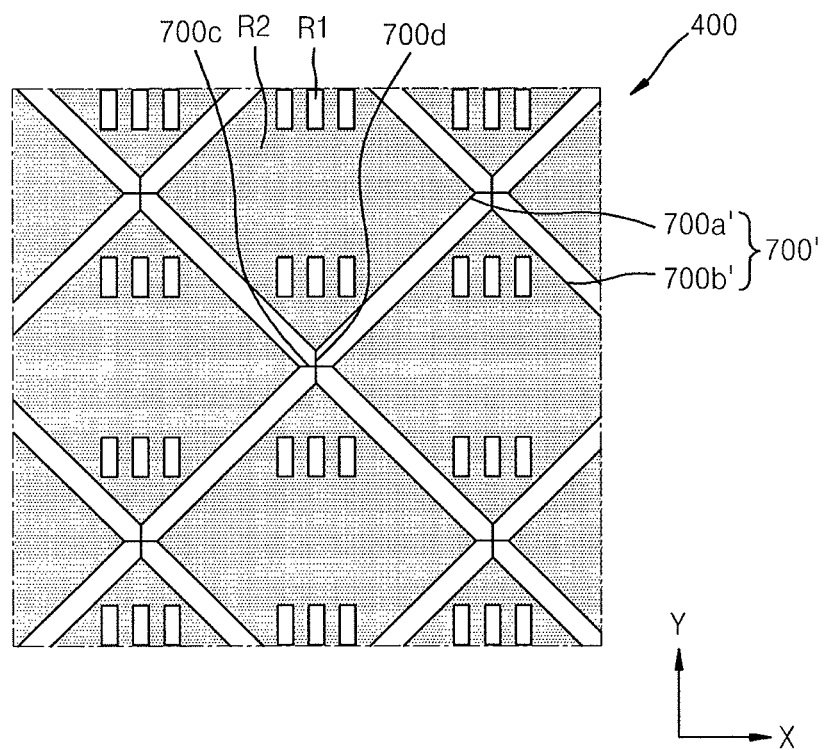
FIG. 10 illustrates a plan view of a reflective member according to another embodiment.

FIG. 10 is a plan view illustrating a reflective member 700' according to another embodiment.

Referring to FIG. 10, the reflective member 700' includes first pattern parts 700a' connected to each other along the X-direction and the second pattern parts 700b' connected to each other along the Y-direction that is substantially perpendicular to the X-direction. The first pattern parts 700a' and the second pattern parts 700b' are alternately disposed. The first pattern parts 700a' and the second pattern parts 700b' may roughly have a diamond (rhombus) shape.

The first pattern part 700a' and the second pattern part 700b' are formed to respectively include a predetermined number of the first regions R1 corresponding to the light-emitting region 31. That is, both the first pattern part 700a' and the second pattern part 700b' illustrated in FIG. 10 have a size larger than that of the first pattern part 700a and the second pattern part 700b illustrated in FIG. 3.

The first pattern parts 700a' are electrically connected and the second pattern parts 700b' are electrically connected, and thus, the first pattern parts 700a and the second pattern parts 700b may respectively act as a sensing electrode. A touch signal sensed by the first pattern part 700a and the second pattern part 700b is provided to a driving circuit (not shown) and the driving circuit may detect a touch position based on the touch signal. That is, according to an embodiment, since the reflective member 700' is patterned to be formed as a grid, a mirror function as well as a touch sensing function may be simultaneously realized.

As described above, according to one or more embodiments, an organic light-emitting display apparatus may realize both a mirror function and a touch sensing function, while not deteriorating display quality and efficiency, by partitioning a reflective member. That is, the organic light-emitting display apparatus according to the embodiments may provide a display function, a mirror function, and a touch sensing function by partitioning the reflective member corresponding to the non-light-emitting region of the display unit into a plurality of patterns. Also, since an insulating layer is formed to cover the resultant plurality of patterns of the reflective member and to have a predetermined reflective function, the organic light-emitting display apparatus having a touch sensing function as well as a mirror function that increases reflection efficiency and does not decrease display efficiency may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
a first substrate including a display unit having a light-emitting region and a non-light-emitting region;
a second substrate parallel to the first substrate; and
a reflective member on a surface of the second substrate that faces the first substrate, the reflective member corresponding to the non-light-emitting region of the display unit and being configured to sense touch, and the reflective member including a plurality of first pattern parts electrically connected along a first direction and a plurality of second pattern parts electrically connected along a second direction.

2. The organic light-emitting display apparatus as claimed in claim 1, wherein the first pattern parts include regions corresponding to the light-emitting region.

3. The organic light-emitting display apparatus as claimed in claim 1, wherein the first direction and the second direction are perpendicular to each other.

4. The organic light-emitting display apparatus as claimed in claim 1, wherein the second substrate further comprises:
first connection parts connecting the first pattern parts;
second connection parts crossing the first connection parts and connecting the second pattern parts; and
an insulating layer on the first pattern parts and the second pattern parts, the insulating layer covering boundaries between the first pattern parts and the second pattern parts.

5. The organic light-emitting display apparatus as claimed in claim 4, wherein the first connection parts include a same material as the first pattern parts.

6. The organic light-emitting display apparatus as claimed in claim 4, wherein the second connection parts are insulated from the first connection parts by the insulating layer, each second connection part being in contact with each of a pair of adjacent second pattern parts.

7. The organic light-emitting display apparatus as claimed in claim 4, wherein the insulating layer includes:
body parts having line shape, the body parts overlapping the first pattern parts along the second direction; and
third connection parts overlapping the first connection parts and connecting adjacent body parts.

8. The organic light-emitting display apparatus as claimed in claim 7, wherein the third connection parts are island-shaped and are connected to the body parts.

9. The organic light-emitting display apparatus as claimed in claim 4, wherein the insulating layer covers a region corresponding to the light-emitting region.

10. The organic light-emitting display apparatus as claimed in claim 4, wherein the insulating layer is a dielectric mirror.

11. The organic light-emitting display apparatus as claimed in claim 4, wherein the insulating layer includes at least one layer having a low refractive index and at least one layer having a high refractive index.

12. The organic light-emitting display apparatus as claimed in claim 11, wherein the insulating layer includes at least one of silicon oxide ($SiO_2$) and silicon nitride ($SiN_x$).

13. The organic light-emitting display apparatus as claimed in claim 4, wherein a refractive index of the insulating layer is higher than a refractive index of the second substrate.

14. A method of manufacturing an organic light-emitting display apparatus, the method comprising:
providing a first substrate including a display unit, the display unit having a light-emitting region and a non-light-emitting region;
providing a second substrate;
forming a reflective member on a surface of the second substrate, such that the reflective member corresponds to the non-light-emitting region and faces the first substrate;
patterning the reflective member to form a plurality of first pattern parts disposed along a first direction and connected to one another, and a plurality of second pattern parts disposed along a second direction; and
connecting the plurality of second pattern parts to one another, and
aligning and bonding the first substrate and the second substrate parallel to the first substrate.

15. The method as claimed in claim 14, further comprising forming an insulating layer on the first pattern parts and the second pattern parts to cover boundaries between the first pattern parts and the second pattern parts.

16. The method as claimed in claim 15, wherein forming the insulating layer includes forming a first insulating layer in a form of a line overlapping the first pattern parts along the second direction and a second insulating layer overlapping a region connecting the first connection parts and connecting adjacent first insulating layers.

17. The method as claimed in claim 15, wherein connecting the second pattern parts includes forming a first connection part that connects the first pattern parts, and a second connection part that is insulated by the insulating layer, crosses the first connection part, and is in contact with each of a pair of the adjacent second pattern parts.

18. The method as claimed in claim 15, wherein forming the insulating layer includes alternately stacking at least one layer having a low refractive index and at least one layer having a high refractive index.

19. The method as claimed in claim 18, wherein the insulating layer includes at least one of silicon oxide ($SiO_2$) and silicon nitride ($SiN_x$).

20. The method as claimed in claim 15, wherein a refractive index of the insulating layer is higher than a refractive index of the second substrate.

\* \* \* \* \*